United States Patent
Mihajlovic et al.

(10) Patent No.: US 10,832,750 B2
(45) Date of Patent: Nov. 10, 2020

(54) PERPENDICULAR SPIN TRANSFER TORQUE MRAM MEMORY CELL WITH CAP LAYER TO ACHIEVE LOWER CURRENT DENSITY AND INCREASED WRITE MARGIN

(71) Applicant: SANDISK TECHNOLOGIES LLC, Addison, TX (US)

(72) Inventors: Goran Mihajlovic, San Jose, CA (US); Tiffany Santos, Palo Alto, CA (US); Jui-Lung Li, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/283,625

(22) Filed: Feb. 22, 2019

(65) Prior Publication Data

US 2020/0273510 A1    Aug. 27, 2020

(51) Int. Cl.
| | |
|---|---|
| G11C 11/16 | (2006.01) |
| H01F 10/32 | (2006.01) |
| H01L 43/02 | (2006.01) |
| H01L 27/22 | (2006.01) |
| H01L 43/10 | (2006.01) |

(52) U.S. Cl.
CPC ........ *G11C 11/161* (2013.01); *G11C 11/1675* (2013.01); *H01F 10/329* (2013.01); *H01F 10/3259* (2013.01); *H01F 10/3286* (2013.01); *H01L 27/222* (2013.01); *H01L 43/02* (2013.01); *H01L 43/10* (2013.01)

(58) Field of Classification Search
CPC ................. G11C 11/161; G11C 11/1675; H01F 10/3259
See application file for complete search history.

(56) References Cited

U.S. PATENT DOCUMENTS

| | | | |
|---|---|---|---|
| 7,596,015 B2 | 9/2009 | Kitagawa | |
| 10,229,723 B1* | 3/2019 | Choi | .............. H01L 43/04 |
| 2006/0102969 A1* | 5/2006 | Huai | .............. B82Y 25/00 |
| | | | 257/421 |

(Continued)

OTHER PUBLICATIONS

Baltzet al. ("Antiferromagnetic spintronics", Reviews of Modern Physics, vol. 90, Jan.-Mar. 2018) (Year: 2018).*

(Continued)

*Primary Examiner* — Mushfique Siddique
(74) *Attorney, Agent, or Firm* — Vierra Magen Marcus LLP

(57) ABSTRACT

A perpendicular spin transfer torque MRAM memory cell includes a magnetic tunnel junction that has a free layer, a pinned layer and a tunnel barrier between the free layer and the pinned layer. The free layer has a switchable direction of magnetization perpendicular to the plane of the free layer. A cap layer is provided adjacent to the magnetic tunnel junction. The thickness of the cap layer is increased so that the cap layer acts as a heating layer, which results in a reduction of the current density during writing and increases the write margin. In some embodiments, a resistive heating layer is added to the memory cell, adjacent to the cap layer, in order to achieve the lower current density and increased write margin while also improving signal to noise ration during reading by eliminating shot noise.

14 Claims, 6 Drawing Sheets

(56) References Cited

U.S. PATENT DOCUMENTS

| | | | | |
|---|---|---|---|---|
| 2009/0246557 | A1* | 10/2009 | Horng | G01R 33/098 428/811.1 |
| 2012/0175716 | A1* | 7/2012 | Bessho | G11C 11/161 257/421 |
| 2014/0008742 | A1* | 1/2014 | Chen | H01L 43/10 257/421 |
| 2014/0175582 | A1* | 6/2014 | Apalkov | H01L 43/08 257/425 |
| 2015/0137289 | A1* | 5/2015 | Khalili Amiri | G11C 11/161 257/421 |
| 2015/0279904 | A1* | 10/2015 | Pinarbasi | H01L 29/66984 257/421 |
| 2017/0117323 | A1* | 4/2017 | Braganca | H01L 43/08 |
| 2017/0125078 | A1* | 5/2017 | Mihajlovic | G11C 11/161 |
| 2017/0170390 | A1* | 6/2017 | Swerts | H01L 43/10 |
| 2017/0372762 | A1* | 12/2017 | Lee | H01L 43/08 |
| 2018/0240966 | A1* | 8/2018 | Mihajlovic | H01L 43/08 |

OTHER PUBLICATIONS

Vass, et al., "Amorphous bismuth-germanium thin films. I. Structural and electrical properties," Journal of Applied Physics 45, 843 (1974); DOI: 10.1063/1.1663328.

Leutenantsmeyer, et al., "Spin-transfer torque switching at ultra low current densities," in Materials Transactions 56(9), May 2014, DOI: 10.2320/matertrans.MA201570 • Source: arXiv.

Hu, et al., "Key Parameters Affecting STT-MRAM Switching Efficiency and Improved Device Performance of 400° C—Compatible p-MTJs," Published in: 2017 IEEE International Electron Devices Meeting (IEDM), Dec. 2017.

J.Z. Sun, "Resistance-area product and size dependence of spin-torque switching efficiency in CoFeB—MgO based magnetic tunnel junctions," Phys. Rev. B 96, 064437—Published Aug. 30, 2017 DOI:https://doi.org/10.1103/PhysRevB.96.064437.

Zhang, et al., "Switching current reduction using MgO cap layer in magnetic tunnel junctions," Applied Physics Letters 112, 242408, Jun. 2018 DOI: 10.1063/1.5035379.

Choi, et al., "Double MgO-based Perpendicular Magnetic-Tunnel-Junction Spin-valve Structure with a Top Co2Fe6B2 Free Layer using a Single SyAF [Co/Pt]n Layer," Scientific Reports 8(1), Dec. 2018 DOI: 10.1038/s41598-018-20626-4.

Jan, et al., "Demonstration of Ultra-Low Voltage and Ultra Low Power STT-MRAM designed for compatibility with 0x node embedded LLC applications," 2018 Symposium on VLSI Technology Digest of Technical Papers DOI: 10.1109/VLSIT.2018.8510672.

Wang, et al., "Possible Spin Pumping Effects on Spin Torque Induced Magnetization Switching in Magnetic Tunneling Junctions," IEEE Transactions on Magenetics, vol. 45, No. 10, Oct. 2009.

Zeng, et al., "Effect of resistance-area product on spin-transfer switching in MgO-based magnetic tunnel junction memory cells," Appl. Phys. Lett. 98, 072512, Feb. 2011 doi.org/10.1063/1.3556615.

Dimitrov, et al., "Dielectric breakdown of MgO magnetic tunnel junctions," Applied Physics Letters 94, 2009 DOI: 10.1063/1.310972.

Deak, "Effect of Resistance-Area-Product and Thermal Environment on Writing of Magneto-Thermal MRAM," IEEE Transactions on Magnetics 42(10):2721-2723 • Oct. 2006 DOI: 10.1109/TMAG.2006.879726.

Ha, et al., "Effect of the resistance-area product on the temperature increase of nanopillar for spin torque magnetic memory," Current Applied Physics 70(2), Sep. 2009 DOI: 10.1016/j.cap.2009.08.013.

* cited by examiner

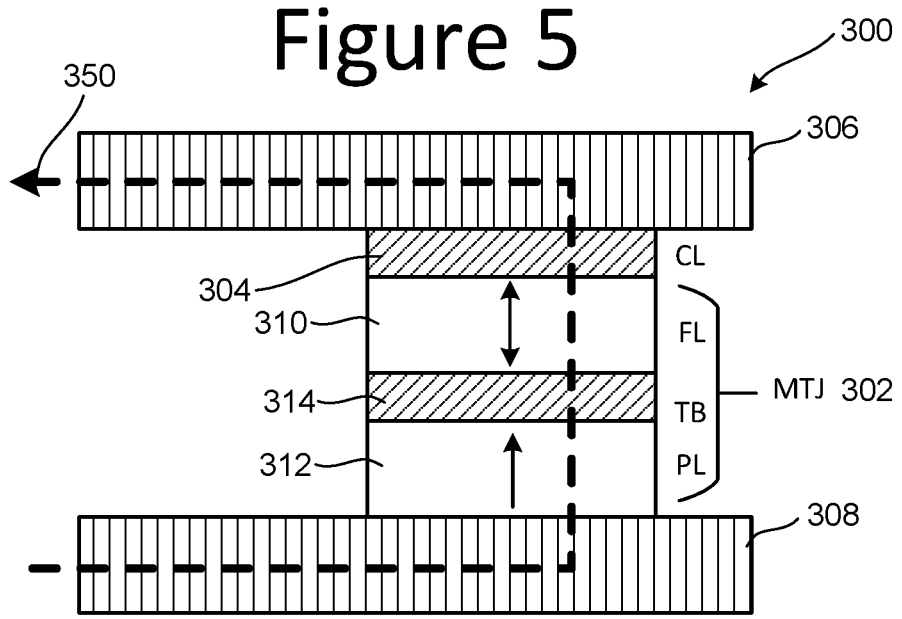
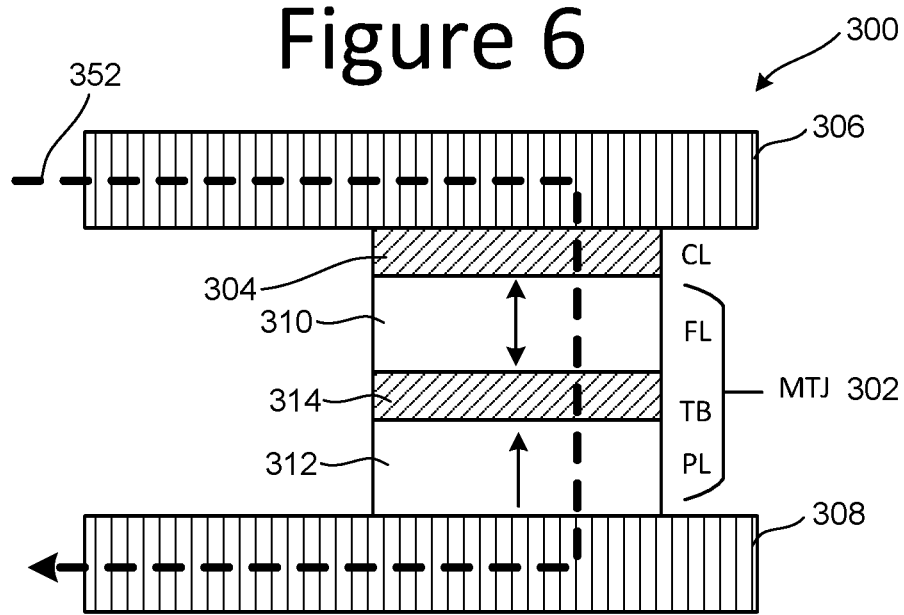

PERPENDICULAR SPIN TRANSFER TORQUE MRAM MEMORY CELL WITH CAP LAYER TO ACHIEVE LOWER CURRENT DENSITY AND INCREASED WRITE MARGIN

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that use electronic charges to store data. Generally, MRAM includes a large number of magnetic memory cells formed on a semiconductor substrate, where each memory cell represents (at least) one bit of data. A bit of data is written to a memory cell by changing the direction of magnetization of a magnetic element within the memory cell, and a bit is read by measuring the resistance of the memory cell (low resistance typically represents a "0" bit and high resistance typically represents a "1" bit). As used herein, direction of magnetization is the direction that the magnetic moment is oriented.

Although MRAM is a promising technology, it is challenging to achieve high bit density and high endurance for fast write operations with previous MRAM memory cell designs.

BRIEF DESCRIPTION OF THE DRAWINGS

Like-numbered elements refer to common components in the different figures.

FIG. 5 is a block diagram of a MRAM memory cell.
FIG. 6 is a block diagram of a MRAM memory cell.

DETAILED DESCRIPTION

Figure 1:
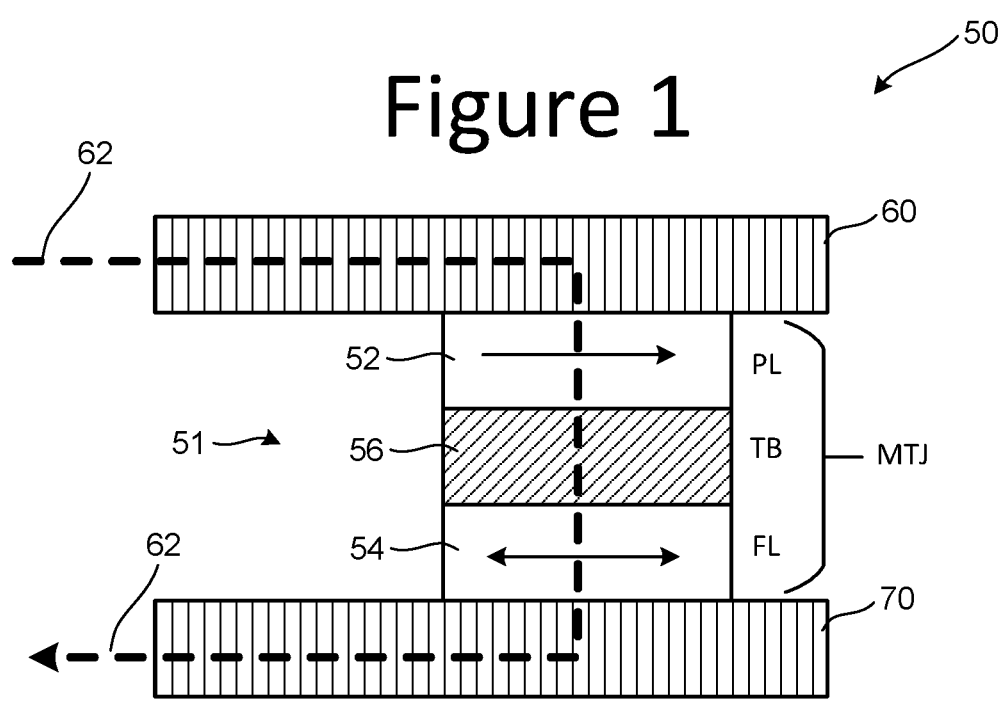
FIG. 1 is a block diagram of a MRAM memory cell.

A perpendicular spin transfer torque MRAM memory cell is proposed that comprises a magnetic tunnel junction that includes a free layer, a pinned layer and a tunnel barrier between the free layer and the pinned layer. The free layer comprises a switchable direction of magnetization that is perpendicular to the plane of the free layer. A cap layer is provided adjacent to the magnetic tunnel junction. The thickness of the cap layer is increased so that the cap layer acts as a heating layer, which results in a reduction of the current density during writing and increases the write margin. In some embodiments, a resistive heating layer is added to the memory cell, adjacent to the cap layer, in order to achieve the lower current density and increased write margin while also improving signal to noise ration during reading.

Spin transfer torque ("STT") is an effect in which the orientation of a magnetic layer in a magnetic tunnel junction can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (usually called the fixed, pinned or reference layer), a spin-polarized current can be produced. If this spin-polarized current is directed into a second magnetic layer (often referred to as the "free layer"), angular momentum can be transferred to this second magnetic layer, changing the direction of magnetization of the second magnetic layer. This is referred to as spin transfer torque.

Spin transfer torque can be used to program or write to MRAM memory. Spin transfer torque magnetic random access memory (STT MRAM) has the advantages of lower power consumption and better scalability over other MRAM which uses magnetic fields to flip the active elements. Spin transfer torque technology has the potential to make possible MRAM devices combining low current requirements and reduced cost; however, the amount of current needed to reorient the magnetization can be too high for most commercial applications, which limits the number of bits that can be fabricated per chip area (i.e. the memory density). This is because a transistor that provides the current to the MRAM device has to be large and thus occupy large a footprint (current through the transistor scales with its size). Also, some STT MRAM has a small write margin. The write margin is the difference between the voltage or current that causes the breakdown of the MRAM device and voltage or current that is needed to reorient the magnetization (i.e. to write the bit). If this margin is small, the number of times that one can write into an MRAM bit before it breaks down, i.e. the MRAM endurance, is also small.

FIG. 1 is a schematic representation of an example STT MRAM memory cell 50. For purposes of this document, a memory cell is the basic unit of storage. Memory cell 50 includes a magnetic tunnel junction (MTJ) 51 comprising an upper ferromagnetic layer 52, a lower ferromagnetic layer 54, and a tunnel barrier (TB) 56, which is an insulating layer between the two ferromagnetic layers. In this example, lower ferromagnetic layer 54 is the free layer (FL) and the direction of its magnetization can be switched. Upper ferromagnetic layer 52 is the pinned (or fixed) layer (PL) and its direction of magnetization cannot be changed (under normal circumstances). When the magnetization in free layer 54 is parallel to the magnetization in pinned layer PL 52, the resistance across the memory cell 50 is relatively low. When the magnetization in free layer FL 54 is anti-parallel to the magnetization in pinned layer PL 52, the resistance across memory cell 50 is relatively high. The data ("0" or "1") in memory cell 50 is read by measuring the resistance of the memory cell 50. In this regard, electrical conductors 60/70 attached to memory cell 50 are utilized to read the MRAM data. By design, both the parallel and antiparallel configurations remain stable in the quiescent state and/or during a read operation (at sufficiently low read current).

In the remaining text and figures, direction of the write current is defined as the direction of the electron flow. Therefore, the term write current refers to an electron current. To "set" the MRAM memory cell bit value (i.e., choose the direction of the free layer magnetization), an electrical write current 62 is applied from conductor 60 to conductor 70. The electrons in the write current become spin-polarized as they pass through pinned layer 52 because pinned layer 52 is a ferromagnetic metal. While conduction electrons in a ferromagnetic metal will have spin orientation collinear with the direction of magnetization, a substantial majority of them will have a particular orientation that is parallel to the direction of magnetization, yielding a net spin polarized current. Electron spin refers to angular momentum, which is directly proportional to but antiparallel in direction to the magnetic moment of the electron, but this directional distinction will not be used going forward for ease of discussion. When the spin-polarized electrons tunnel across the tunnel barrier 56, conservation of angular momentum can result in the imparting of a torque on both free layer 54 and pinned layer 52, but this torque is inadequate (by design) to affect the magnetization direction of the pinned layer. Contrastingly, this torque is (by design) sufficient to switch the magnetization orientation in the free layer 54 to become parallel to that of the pinned layer 52 if the initial magnetization orientation of the free layer 54 was antiparallel to the pinned layer 52. The parallel magnetizations will then remain stable before and after such write current is turned off. In contrast, if free layer 54 and pinned layer 52 magnetizations are initially parallel, the free layer magnetization can be STT switched to become antiparallel to the pinned layer 52 by application of a write current of opposite direction to the aforementioned case. Thus, by way of the same STT physics, the direction of the magnetization of free layer 54 can be deterministically set into either of two stable orientations by judicious choice of the write current direction (polarity).

Figure 2:
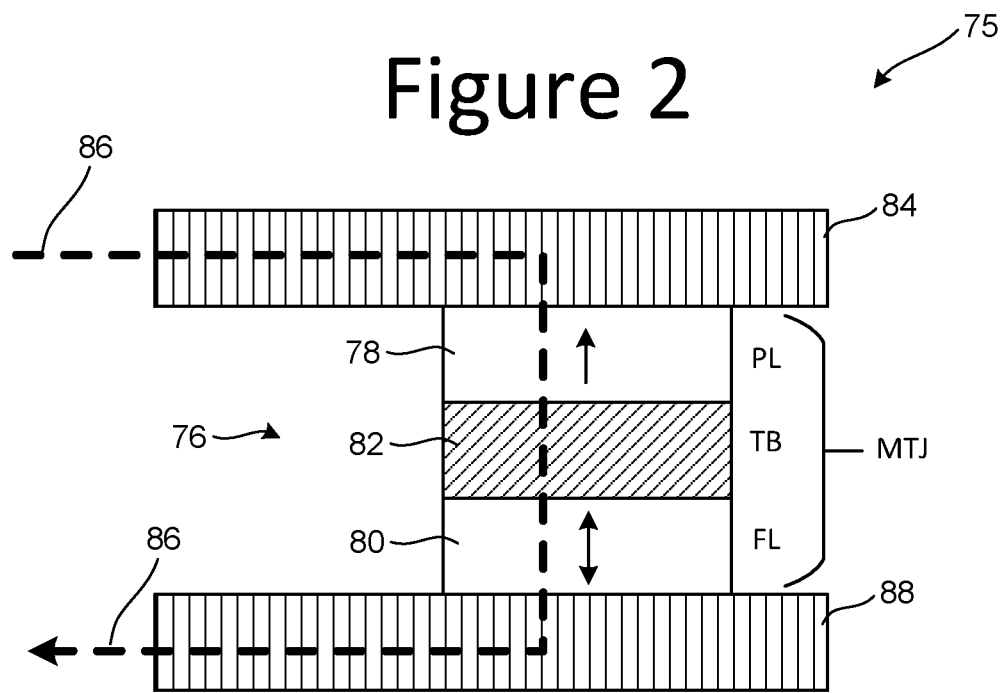
FIG. 2 is a block diagram of a MRAM memory cell.

The MRAM memory cell of FIG. 1 uses materials in which both the pinned and free layer magnetization are in the in-plane direction. In contrast, FIG. 2 depicts a schematic representation of a STT switching MRAM memory cell 75 in which both the pinned and free layer magnetization are in the perpendicular direction (i.e. perpendicular to the plane defined by the free layer and perpendicular to the plane defined by the pinned layer). Memory cell 75 includes a magnetic tunnel junction (MTJ) 76 comprising an upper ferromagnetic layer 78, a lower ferromagnetic layer 80, and a tunnel barrier (TB) 82 which is an insulating layer between the two ferromagnetic layers. In this example, lower ferromagnetic layer 80 is the free layer FL and the direction of its magnetization can be switched. Upper ferromagnetic layer 78 is the pinned (or fixed) layer PL and the direction of its magnetization is not changeable. When the magnetization in free layer 80 is parallel to the magnetization in pinned layer PL 78, the resistance across the memory cell 75 is relatively low. When the magnetization in free layer FL 80 is antiparallel to the magnetization in pinned layer PL 78, the resistance across memory cell 75 is relatively high. The data ("0" or "1") in memory cell 75 is read by measuring the resistance of the memory cell 75. In this regard, electrical conductors 84/88 attached to memory cell 75 are utilized to read the MRAM data. By design, both the parallel and antiparallel configurations remain stable in the quiescent state and/or during a read operation (at sufficiently low read current). To "set" the MRAM cell bit value (i.e., choose the direction of the free layer magnetization), an electrical write current 86 is applied from conductor 84 to conductor 88 and the memory cell operates as discussed above with respect to FIG. 1.

Compared to the earliest MRAM cells which used magnetic fields from current carrying conductors proximate to the MRAM cell, the STT switching technique requires relatively low power, virtually eliminates the problem of adjacent bit disturbs, and has more favorable scaling for higher memory cell densities (reduced MRAM cell size). The latter issue also favors STT MRAM where the free and pinned layer magnetizations are orientated perpendicular to the film plane, rather than in-plane.

Figure 3:
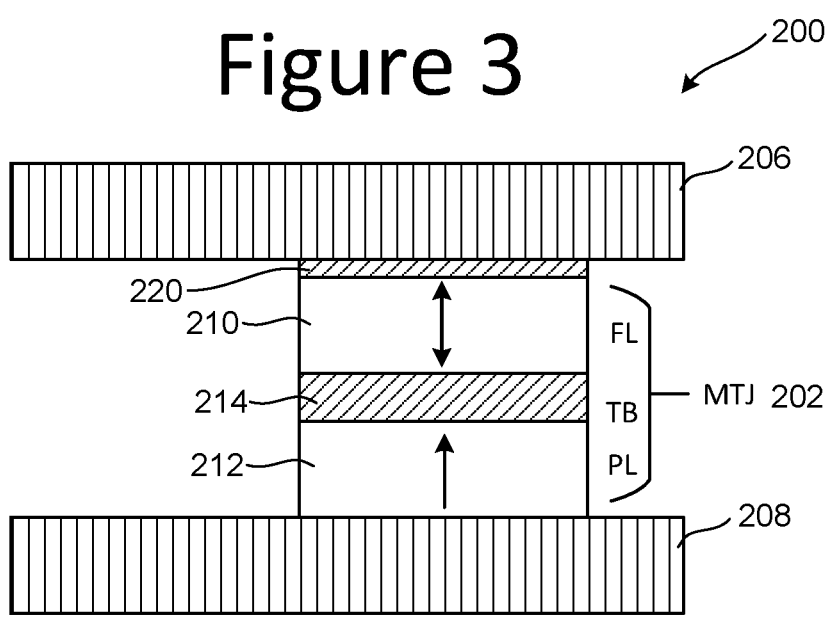
FIG. 3 is a block diagram of a MRAM memory cell.

FIG. 3 depicts a schematic representation of another example of a STT-switching MRAM memory cell 200 in which both the pinned and free layer magnetization are in the perpendicular direction. Memory cell 200 includes a magnetic tunnel junction (MTJ) 202 comprising an upper ferromagnetic layer 210, a lower ferromagnetic layer 212, and a tunnel barrier (TB) 214 serving as an insulating layer between the two ferromagnetic layers. In this example, upper ferromagnetic layer 210 is the free layer FL and the direction of its magnetization can be switched. Lower ferromagnetic layer 212 is the pinned (or fixed) layer PL and the direction of its magnetization cannot be changed. Memory cell 200 also includes a cap layer 220 that is adjacent to MTJ 202 (e.g., adjacent to free layer 210). Cap layer 220 is used in order to provide additional perpendicular anisotropy to the FL 210. In the past, cap layer 220 has been implemented to be as thin as possible so that its resistance is negligible as compared to the resistance of the tunnel barrier 214, which dominates the resistance of the MRAM memory cell.

Some challenges to developing memory systems that use STT MRAM include reducing the switching current and increasing the write margin. For example, switching from the state where the direction of magnetization of the free layer is parallel to the direction of magnetization of the pinned layer to the state where the direction of magnetization of the free layer is anti-parallel to the direction of magnetization of the pinned layer uses a larger write current. In general, it is desired to have a lower write current. The write current is the current applied to the memory cell to change the direction of magnetization of the free layer. There are at least two reasons for having a lower write current. First, some memory systems use a transistor (e.g., a NMOS transistor) to connect the word line (or other control line) to the memory cell. If the write current is high, a larger transistor is needed which results in less room available for memory cells and, thus, a lower density memory (equivalent to lower capacity for the given memory chip area). Second, using higher current will more quickly drain the batteries of mobile devices that include the memory system.

The write margin is defined as the difference between the write voltage (the voltage applied to the memory cell to change the direction of magnetization of the free layer) and the breakdown voltage for the memory cell. The greater the write margin, the higher is the endurance of the memory cell (i.e. the number of times that cell can be written into reliably).

According to the STT MRAM macrospin theory, the write voltage depends linearly on resistance area product ("RA") of the MRAM cell. For a given layer of material, RA is defined as:

$$RA = RP \times SA \qquad \text{Eq. (0)}$$

where RP is the resistance of a layer of material to current applied in the perpendicular direction (orthogonal to the surface area) and SA is the surface area of that layer of material. The total RA for the memory cell is equal to the sum of RAs of all of its layers, including also the contribution from interfacial resistances between different layers. However, the RA of tunnel barrier and the RA of the cap layer (which are made of high resistivity insulating material), are so much larger than those of other layers and interfaces between them (which are made of low resisitivity metals) that the latter can be neglected. However, the RA of the tunnel barrier itself depends on the relative magnetization orientations of RL and FL adjacent to it, as the conduction through the tunnel barrier occurs via spin polarized tunneling which is partially suppressed when magnetizations of the RL and the FL are oriented antiparallel to each other. By convention, RA of the tunnel barrier is defined for the case when magnetizations of the RL and the FL are oriented parallel to each other. Therefore, when a STT MRAM memory cell has a cap layer, the total RA for the memory cell is equal to the sum of RA of the tunnel barrier (defined for the parallel magnetization orientations of the RL and the FL) and the RA of the cap layer.

It has been observed that RA of the MRAM cell is exponentially dependent on the thickness t of the of the tunnel barrier, such that:

$$RA = (RA0)e^{\alpha t} \qquad \text{Eq. (1)}$$

where RA0 is a constant representing RA in the limit of zero thickness of the tunnel barrier (i.e. the residual RA of the metallic layers comprising the MRAM cell, typically in the range 0.05-0.1 $\Omega\mu m^2$) and $\alpha$ is a constant representing the dimension of an inverse length.

The current density needed for switching the direction of magnetization of the free layer was expected to be independent of RA. However, it has been observed that current density decreases with increasing RA. Thus, making the tunnel barrier thicker will lead to an increase in RA and a decrease in current density when writing to a STT MRAM memory cell. Reducing current density lowers the write current needed for a write operation (i.e., switching the direction of magnetization of the free layer).

The inventors have found that increasing the thickness of the cap layer will increase the RA of the cap layer, increase the total RA for the memory cell, and result in a decrease in current density when writing to a STT MRAM memory cell. The reduction in the write current density is mainly caused by heating of the magnetic tunnel junction by the cap layer in response to the write current. The thicker the cap layer is made, the more the current density is reduced. The inventors have also found that the current density to write the MRAM cell is proportional to the total RA of the cell, regardless of whether RA is all due to the tunnel barrier or split between the tunnel barrier and the cap layer. In prior art devices, engineers sought to make RA of the cap layer negligible. However, the present inventors propose to make the resistance area product of the cap layer to be at least 20% (or 20-50%) of a total resistance area product of a combination of resistance area product of the cap layer and resistance area product of the tunnel barrier. For example, if a memory cell has a total resistance area product of 10 $\Omega\mu m^2$, the tunnel barrier has an resistance area product of 8 $\Omega\mu m^2$ and the cap layer has an resistance area product of 2 $\Omega\mu m^2$, then the RA of the cap layer is 20% of a total resistance area product of a combination of resistance area product of the cap layer and resistance area product of the tunnel barrier.

Dividing the RA between the cap layer and the tunnel barrier results in a higher write margin. In order to illustrate that, consider that the breakdown of the tunnel barrier happens when certain value of the electric field across the barrier is reached, called the breakdown electric field $E_{bd}$. This $E_{bd}$ is related to the breakdown voltage as $V_{bd} = E_{bd} t$, where t is the tunnel barrier thickness. Thus expressing $t = V_{bd}/E_{bd}$ in the Eq.(1) we can see that $$V_{bd} = \frac{E_{bd}}{\alpha} \ln\left(\frac{RA}{RA0}\right) \qquad \text{Eq.(2)}$$

Thus, the breakdown voltage depends logarithmically on RA. The same is true for the cap layer breakdown voltage. Thus, if we split the total RA between the tunnel barrier and the cap layer, the breakdown voltage of each of these layers will be reduced much less than linear with RA (i.e. proportional to ln(RA) based on Eq.(2)), while, for the applied write voltage, the voltage drop across each of them will be divided proportional to their respective RAs. As a consequence the write margin will increase. For example, let's compare a MRAM memory cell with RA=10 $\Omega\mu m^2$ in the tunnel barrier with a MRAM cell that has RA=5 $\Omega\mu m^2$ in the tunnel barrier and RA=5 $\Omega\mu m^2$ in the cap layer. Let us assume that write voltage for RA=10 $\Omega\mu m^2$ cell is 0.8 V and breakdown voltage is 1.1 V. Hence the write margin is 0.3 V. Assuming RA0=0.1 $\Omega\mu m^2$ we can use Eq.(2) to calculate $$\frac{E_{bd}}{\alpha} = 0.239 \text{ V}.$$

Then for RA=5 $\Omega\mu m^2$ we obtain breakdown voltage of 0.93 V for the tunnel barrier and the same 0.93 V for the cap layer. Thus the breakdown voltage of the cell is 1.86 V and the write margin increases to 1.06 V, or more than 3 times.

Figure 4:
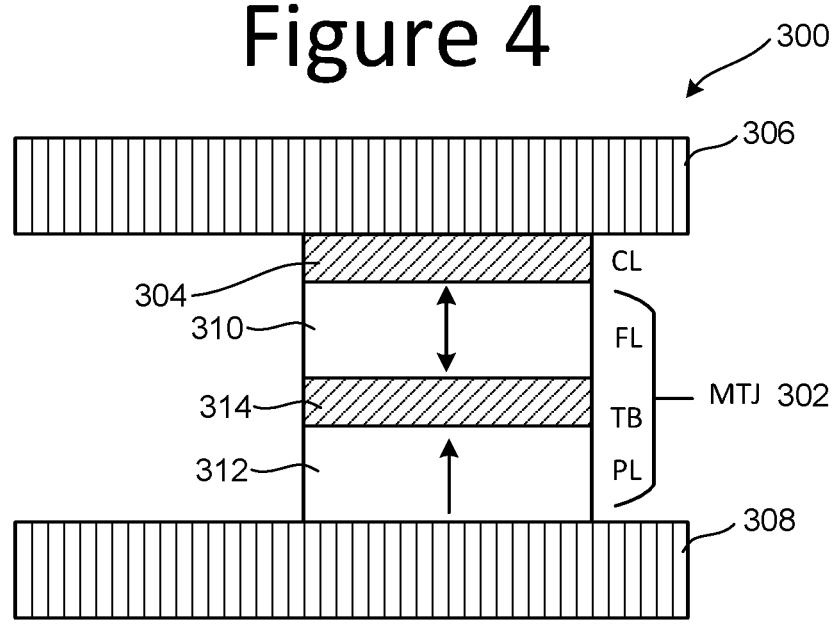
FIG. 4 is a block diagram of a MRAM memory cell.

FIG. 4 depicts a schematic representation of an example of a STT-switching MRAM memory cell 300 in which both the pinned and free layer magnetization are in the perpendicular direction and that utilizes a cap layer with increased thickness in order to lower current density and increase write margin, as explained above. Memory cell 300 includes a magnetic tunnel junction (MTJ) 302 comprising an upper ferromagnetic layer 310, a lower ferromagnetic layer 312, and a tunnel barrier (TB) 314 as an insulating layer between the two ferromagnetic layers. In this example, upper ferromagnetic layer 310 is the free layer FL and the direction of its magnetization can be switched. Lower ferromagnetic layer 312 is the pinned (or fixed) layer PL and the direction of its magnetization cannot be switched. When the magnetization in free layer 310 is parallel to the magnetization in pinned layer PL 312, the resistance across the memory cell 300 is relatively low. When the magnetization in free layer FL 310 is anti-parallel to the magnetization in pinned layer PL 312, the resistance across memory cell 300 is relatively high. The data ("0" or "1") in memory cell 300 is read by measuring the resistance of the memory cell 300. In this regard, electrical conductors 306/308 attached to memory cell 300 are utilized to read the MRAM data. By design, both the parallel and antiparallel configurations remain stable in the quiescent state and/or during a read operation (at sufficiently low read current).

For both the pinned layer PL 312 and free layer FL 310, the direction of magnetization is in the perpendicular direction (i.e. perpendicular to the plane defined by the free layer and perpendicular to the plane defined by the pinned layer). For example, FIG. 4 shows the direction of magnetization of pinned layer PL 312 as up and the direction of magnetization of free layer FL 310 as switchable between up and down, which is perpendicular to the plane.

In one embodiment, tunnel barrier 314 is made of Magnesium Oxide (MgO); however, other materials can also be used. Free layer 310 is a ferromagnetic metal that possess the ability to change/switch its direction of magnetization. Multilayers based on transition metals like Co, Fe and their alloys can be used to form free layer 310. In one embodiment, free layer 310 comprises an alloy of Cobalt, Iron and Boron. Pinned layer 312 can be many different types of materials including (but not limited to) multiple layers of Cobalt and Platinum and/or an alloy of Cobalt and Iron.

Memory cell 300 includes cap layer 304 adjacent magnetic tunnel junction 302. In one set of embodiments, cap layer 304 is adjacent free layer 310 such that cap layer 304 is touching free layer 310 and forming an interface with free layer 310. FIG. 4 shows cap layer 304 between and in contact with electrical conductor 306 and free layer 310. In one embodiment, cap layer 304 comprises MgO. In other embodiments, other oxides can be used such as (but not limited to) Hafnium Oxide, Tungsten Oxide, Aluminum Oxide, or Titanium Oxide. The thickness of cap layer 304 is set such that the RA of cap layer 304 RA is at least 20% of a total RA of a combination of the RA of the cap layer 304 and the RA of tunnel barrier 314. In some embodiments, the RA of the cap layer is proposed to be 20-50% of the combination of the RA of the cap layer 304 and the RA of tunnel barrier 314 (or of a total RA of the memory cell). In some embodiments, cap layer 304 and tunnel barrier 314 have the same RA (thus, the RA of the cap layer is 50% of the total RA).

In one example implementation, free layer 310 has a thickness of 2.0 nm, pinned layer 312 has a thickness of 3.5 nm, tunnel barrier 314 has a thickness of 1.0 nm, and cap layer 304 has a thickness of 0.8 nm. In another example implementation, cap layer 304 and tunnel barrier 314 have the same thickness.

To "set" the MRAM memory cell bit value (i.e., choose the direction of the free layer magnetization), an electrical write current 350 is applied from conductor 308 to conductor 306, as depicted in FIG. 5. The electrons in the write current 350 become spin-polarized as they pass through pinned layer 312 because pinned layer 312 is a ferromagnetic metal. When the spin-polarized electrons tunnel across the tunnel barrier 314, conservation of angular momentum can result in the imparting of a spin transfer torque on both free layer 310 and pinned layer 312, but this torque is inadequate (by design) to affect the magnetization direction of the pinned layer 312. Contrastingly, this spin transfer torque is (by design) sufficient to switch the magnetization orientation in the free layer 310 to become parallel to that of the pinned layer 312 if the initial magnetization orientation of the free layer 210 was antiparallel to the pinned layer 312. The parallel magnetizations will then remain stable before and after such write current is turned off.

In contrast, if free layer 310 and pinned layer 312 magnetizations are initially parallel, the direction of magnetization of free layer 310 can be switched to become antiparallel to the pinned layer 312 by application of a write current of opposite direction to the aforementioned case. For example, write current 352 is applied from conductor 306 to conductor 308, as depicted in FIG. 6. Thus, by way of the same STT physics, the direction of the magnetization of free layer 310 can be deterministically set into either of two stable orientations by judicious choice of the write current direction (polarity).

As described above, the cap layer 304 is configured to heat magnetic tunnel junction 302 in response to a current through the cap layer 304 (the current also goes through MTJ 302). This heating is in addition to the heating already generated in the MTJ by the current through the tunnel barrier and it results in the lower current density and increased write margin as discussed above.

Figure 7:
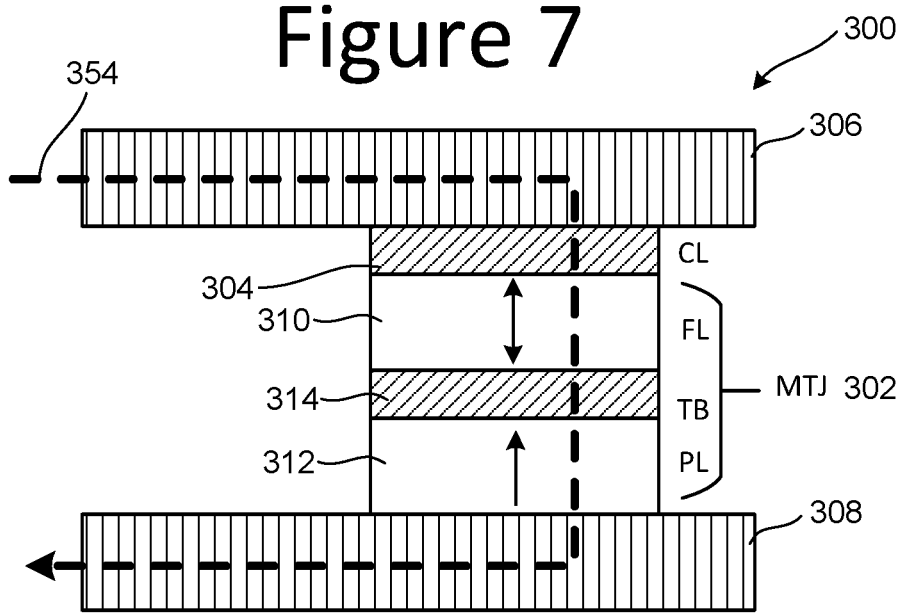
FIG. 7 is a block diagram of a MRAM memory cell.

FIG. 7 depicts memory cell 300 during a reading operation. The data ("0" or "1") in memory cell 300 is read by measuring the resistance of the memory cell 300. Low resistance typically represents a "0" bit and high resistance typically represents a "1" bit. FIG. 7 shows a read current 354 being applied across the memory cell (e.g., across the magnetic tunnel junction 302) by applying the read current 354 from conductor 306 to conductor 308. Alternatively, the read current 354 can be applied from conductor 306 to conductor 308.

Figure 8:
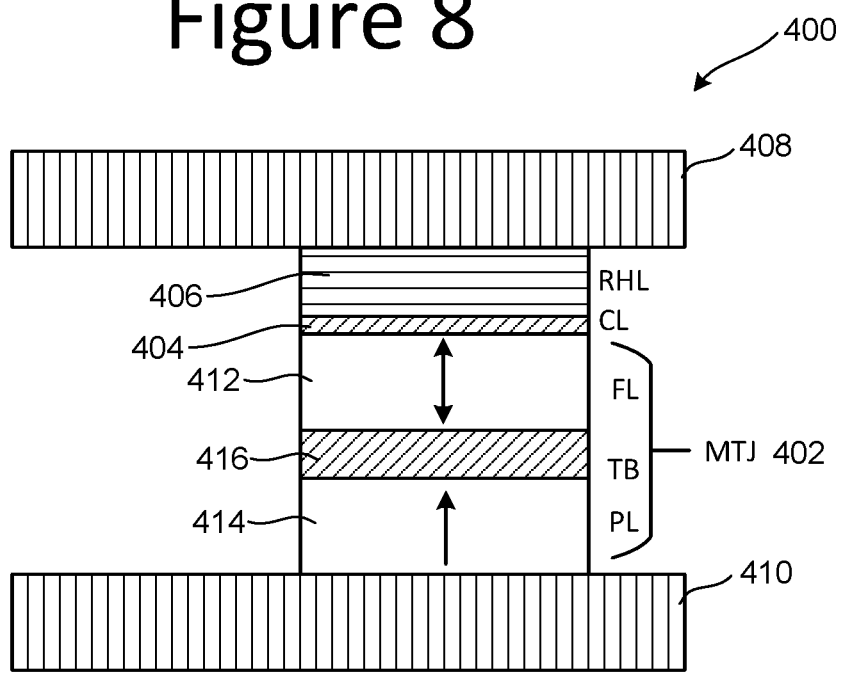
FIG. 8 is a block diagram of a MRAM memory cell.

FIG. 8 depicts a schematic representation of another example of a STT MRAM memory cell 300 in which both the pinned and free layer magnetization are in the perpendicular direction. Memory cell 400 includes a magnetic tunnel junction (MTJ) 402 comprising an upper ferromagnetic layer 412, a lower ferromagnetic layer 414, and a tunnel barrier (TB) 416 as an insulating layer between the two ferromagnetic layers. In this example, upper ferromagnetic layer 412 is the free layer FL and the direction of its magnetization can be switched. Lower ferromagnetic layer 414 is the pinned (or fixed) layer PL and its direction of magnetization cannot be changed. Memory cell 400 includes a cap layer 404 adjacent magnetic tunnel junction 402. In one set of embodiments, cap layer 404 is adjacent free layer 412 such that cap layer 404 is touching free layer 412 and forming an interface with free layer 412.

When the magnetization in free layer 412 is parallel to the magnetization in pinned layer PL 414, the resistance across the memory cell 400 is relatively low. When the magnetization in free layer FL 412 is anti-parallel to the magnetization in pinned layer PL 414, the resistance across memory cell 400 is relatively high. The data ("0" or "1") in memory cell 400 is read by measuring the resistance of the memory cell 400, in the same manner as discussed above with respect to memory cell 300. In this regard, electrical conductors 408/410 attached to memory cell 400 are utilized to read the MRAM data. By design, both the parallel and antiparallel configurations remain stable in the quiescent state and/or during a read operation (at sufficiently low read current).

Memory cell 400 also includes a resistive heater layer RHL 406. In one embodiment, resistive heater layer 406 is positioned between (an in contact with) cap layer 404 and electrical conductor 408. Thus, resistive heating layer 406 is separate from and adjacent to the cap layer. In one embodiment, the resistive heating layer 406 is a highly resistive layer that does not promote electron tunneling, hence not exhibiting electronic shot noise that is related to the tunneling, and has a resistivity of 1-10 $\Omega$cm. Resistive heating layer 406 is configured to heat the magnetic tunnel junction 402 in response to a current that runs through both of resistive heating layer 406 and magnetic tunnel junction 402. The heat from resistive heating layer 406 serves to lower current density and increase write margin for memory cell 400. In one embodiment, resistive heating layer 406 is a semiconductor thin film such as germanium or amorphous BiGe alloys. In another embodiment, resistive heating layer 406 is made of a doped material, such as doped silicon. In one set of examples, resistive heating layer 406 has a thickness of 1-10 nm. Using resistive heating layer 406 in memory cell 400 provides for an improved signal to noise ratio during the reading process as it eliminates electronic shot noise associated with tunneling, while preserving the advantages of the lower write current density and increased write margin discussed above with respect to memory cell 300 of FIG. 4.

Memory cell 400 of FIG. 8 performs a write operation by applying write currents in the same manner as discussed above with respect to memory cell 300 of FIG. 4. The difference in the write processes of memory cell 300 and memory cell 400 is that heat is provided in memory cell 400 mainly by resistive heating layer 406 while the insulating cap layer is kept thin, while memory cell 300 does not have a resistive heating layer but utilizes thick MgO cap layer to generate heat.

In some embodiments of memory cell 400 of FIG. 8, cap layer 404 is made thin enough so that the RA of cap layer 404 is negligible and the amount of heat it generates is negligible. In other embodiments, cap layer 404 is made thick enough so that its RA is not negligible and does have an effect on current density and write margin. In such an embodiment, heat is then generated by resistive heating layer 406 and cap layer 404; or by the combination of resistive heating layer 406, cap layer 404 and tunnel barrier 416. In some examples, resistive heating layer 406 is made thick enough to provide most of the heat for the memory cell, or at least significantly more heat than cap layer 404.

Figure 9:
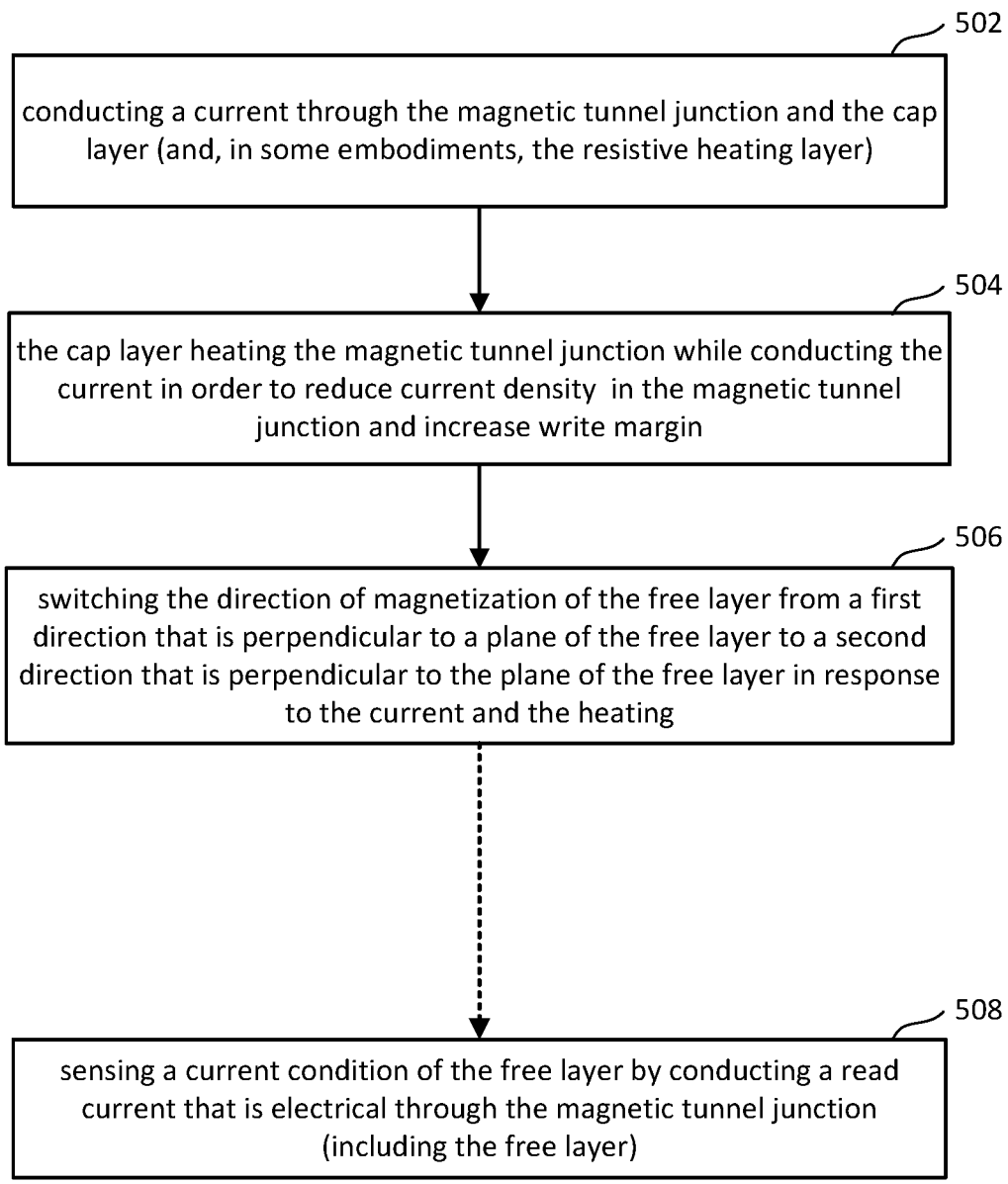
FIG. 9 is a flow chart describing one embodiment of a process performed to write data to a MRAM memory cell.

FIG. 9 is a flow chart describing one embodiment of a process performed to write data to a non-volatile STT MRAM memory cell, such as memory cell 300 of FIGS. 4-7 and memory cell 400 of FIG. 8. In step 502, a current is conducted through the magnetic tunnel junction and the cap layer (and, in some embodiments, the resistive heating layer). For example, currents 350 or 352 (see FIGS. 5 & 6) can be applied to the memory cell. In embodiments that have a resistive heating layer (such as resistive heating layer 406 of FIG. 8), step 502 includes conducting the current through the magnetic tunnel junction, the cap layer, and the resistive heater layer. In step 504, in response to the current through the cap layer and the magnetic tunnel junction, the cap layer (and/or the resistive heating layer and/or the tunnel barrier) heats the magnetic tunnel junction while conducting the current which reduces current density in the magnetic tunnel junction and increases write margin, as explained above. In step 506, the direction of magnetization of the free layer switches by spin transfer torque from a first direction that is perpendicular to a plane of the free layer to a second direction, opposite the first direction, that is perpendicular to the plane of the free layer in response to the current and the heating, as explained above. At this point, the memory cell has been written to. Later on, in step 508, a read process can be performed by sensing a condition of the free layer by conducting a read current that is electrical through the magnetic tunnel junction (including the free layer), for example, as depicted in FIG. 7 and described above.

Figure 10:
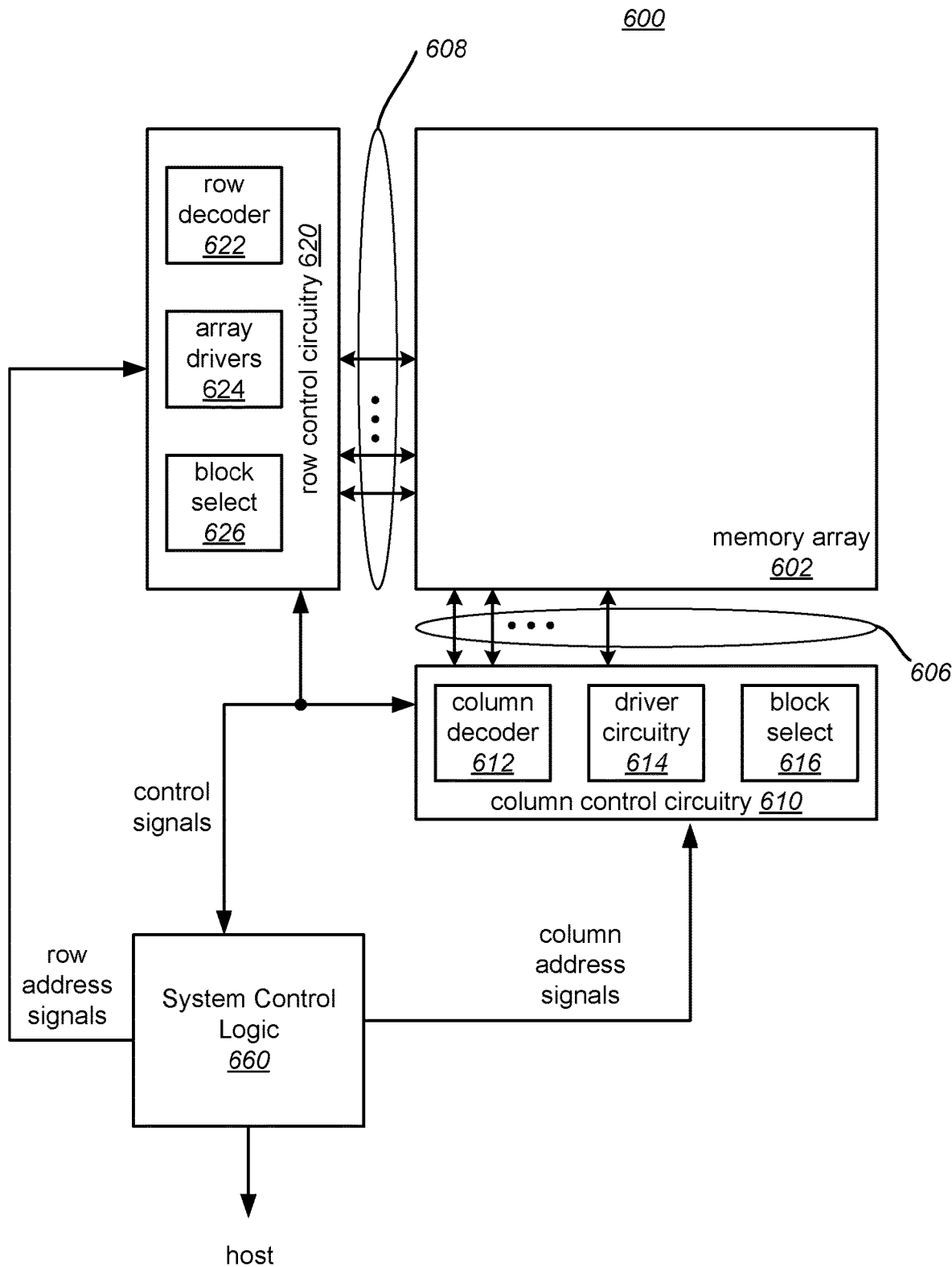
FIG. 10 is a block diagram of a memory system using the new memory cell proposed herein.

FIG. 10 is a block diagram that depicts one example of a memory system 600 that can implement the technology described herein. Memory system 600 includes a memory array 602 that can include any of memory cells described above. The array terminal lines of memory array 602 include the various layer(s) of word lines organized as rows, and the various layer(s) of bit lines organized as columns. However, other orientations can also be implemented. Memory system 600 includes row control circuitry 620, whose outputs 608 are connected to respective word lines of the memory array 602. Row control circuitry 620 receives a group of M row address signals and one or more various control signals from System Control Logic circuit 660, and typically may include such circuits as row decoders 622, array terminal drivers 624, and block select circuitry 626 for both reading and writing operations. Memory system 600 also includes column control circuitry 610 whose input/outputs 606 are connected to respective bit lines of the memory array 602. Column control circuitry 606 receives a group of N column address signals and one or more various control signals from System Control Logic 660, and typically may include such circuits as column decoders 612, array terminal receivers or drivers 614, block select circuitry 616, as well as read/write circuitry, and I/O multiplexers. System control logic 660 receives data and commands from a host and provides output data and status to the host. In other embodiments, system control logic 660 receives data and commands from a separate controller circuit and provides output data to that controller circuit, with the controller circuit communicating with the host. System control logic 660 may include one or more state machines, registers and other control logic for controlling the operation of memory system 600.

In one embodiment, all of the components depicted in FIG. 9 are arranged on a single integrated circuit. For example, system control logic 660, column control circuitry 610 and row control circuitry 620 are formed on the surface of a substrate and memory array 602 is formed one or above the substrate.

The above-described embodiments provide for a transfer torque MRAM memory cell has a lower switching current and an increased write margin due to the heating effect of the cap layer and/or resistive heating layer. The lower current allows the memory cell to operate more efficiently. The increased write margin allows the memory cell to improve endurance and reliability.

The above-described embodiments of STT MRAM memory cells of FIGS. 4-8 have free layers with directions of magnetization that are perpendicular to the plane. This is a significant difference to memory cells that have free layers with directions of magnetization that are in-plane. For example, if a demagnetizing field for an in-plane STT MRAM memory cell is lowered, then switching current may also be lowered; however, a lower demagnetizing field in a perpendicular STT MRAM memory cell will cause the net perpendicular magnetic anisotropy of the memory cell to be higher and the switching current will therefore increase.

One embodiment includes an apparatus that comprises a magnetic tunnel junction and a cap layer adjacent the magnetic tunnel junction. The magnetic tunnel junction comprises a fixed layer having fixed direction of magnetization that is perpendicular to a plane of the fixed layer, a free layer having a direction of magnetization that can be switched and is perpendicular to a plane of the free layer, and a tunnel barrier between the fixed layer and the free layer. The cap layer comprises a thickness such that the cap layer contributes at least 20% of a total resistance area product of a combination of resistance area product of the cap layer and resistance area product of the tunnel barrier.

One embodiment includes an apparatus that comprises a fixed ferromagnetic layer having a fixed direction of magnetization, a free ferromagnetic layer having a direction of magnetization that can be switched, a tunnel barrier between the fixed ferromagnetic layer and the free ferromagnetic layer, a cap layer adjacent the free ferromagnetic layer, and a resistive heating layer adjacent the cap layer.

One embodiment includes a method comprising writing to a non-volatile spin transfer torque MRAM memory cell that includes a magnetic tunnel junction and a cap layer adjacent the magnetic tunnel junction. The magnetic tunnel junction includes a free ferromagnetic layer having a direction of magnetization that can be switched. The method of writing comprises conducting a current through the magnetic tunnel junction and the cap layer, the cap layer heating the magnetic tunnel junction while conducting the current in order to reduce current density in the magnetic tunnel junction, and switching the direction of magnetization of the free layer from a first direction that is perpendicular to a plane of the free layer to a second direction that is perpendicular to the plane of the free layer in response to the current and the heating.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a magnetic tunnel junction comprising a fixed layer having fixed direction of magnetization that is perpendicular to a plane of the fixed layer, a free layer having a direction of magnetization that can be switched and is perpendicular to a plane of the free layer, and a tunnel barrier between the fixed layer and the free layer; and
a cap layer adjacent the magnetic tunnel junction, the cap layer comprising a thickness such that the cap layer contributes 20%-50% of a total resistance area product of the memory cell, the cap layer configured to heat the magnetic tunnel junction while conducting current in order to reduce current density in the magnetic tunnel junction, the free layer configured to switch direction of magnetization of the free layer from a first direction that is perpendicular to the plane of the free layer to a second direction that is perpendicular to the plane of the free layer in response to the current and the heating.

2. The apparatus of claim 1, further comprising:
a resistive heating layer separate from and adjacent to the cap layer.

3. The apparatus of claim 2, wherein:
the resistive heating layer is a highly resistive layer that does not promote electron tunneling.

4. The apparatus of claim 2, wherein:
the resistive heating layer has a resistivity of 1-10 $\Omega$cm.

5. The apparatus of claim 2, wherein:
the resistive heating layer is a semiconductor thin film.

6. The apparatus of claim 2, wherein:
the resistive heating layer includes germanium or is an amorphous BiGe alloy.

7. The apparatus of claim 1, wherein:
the cap layer and the tunnel barrier are MgO.

8. The apparatus of claim 1, wherein:
the cap layer and the tunnel barrier have a same thickness.

9. The apparatus of claim 1, wherein:
the cap layer is adjacent the free layer;
the magnetic tunnel junction and the cap layer form a non-volatile spin transfer torque MRAM memory cell; and
the free layer is configured to switch direction of magnetization by spin transfer torque.

10. An apparatus, comprising:
a magnetic tunnel junction comprising a fixed layer having fixed direction of magnetization that is perpendicular to a plane of the fixed layer, a free layer having a direction of magnetization that can be switched and is perpendicular to a plane of the free layer, and a tunnel barrier between the fixed layer and the free layer; and
a cap layer adjacent the magnetic tunnel junction, the cap layer comprising a thickness such that the cap layer contributes at least 20% of a total resistance area product of a combination of resistance area product of the cap layer and resistance area product of the tunnel barrier, resistance area product of the cap layer is equivalent to the resistance area product of the tunnel barrier.

11. An apparatus, comprising:
a fixed ferromagnetic layer having a fixed direction of magnetization;
a free ferromagnetic layer having a direction of magnetization that can be switched;
a tunnel barrier between the fixed ferromagnetic layer and the free ferromagnetic layer;
a cap layer adjacent the free ferromagnetic layer; and
a resistive heating layer adjacent the cap layer, the resistive heating layer has a resistivity of 1-10 $\Omega$cm, the resistive heating layer includes germanium or is an amorphous BiGe alloy.

12. The apparatus of claim 11, wherein:
the resistive heating layer is a highly resistive layer that does not promote electron tunneling.

13. A method, comprising;
writing to a non-volatile spin transfer torque MRAM memory cell that includes a magnetic tunnel junction and a cap layer adjacent the magnetic tunnel junction, the magnetic tunnel junction includes a free ferromagnetic layer having a direction of magnetization that can be switched, the writing comprises:
conducting a current through the magnetic tunnel junction and the cap layer;
the cap layer heating the magnetic tunnel junction while conducting the current in order to reduce current density in the magnetic tunnel junction, the cap layer contributes 20-50% of the resistance area product of the memory cell; and
switching the direction of magnetization of the free layer from a first direction that is perpendicular to a plane of the free layer to a second direction that is perpendicular to the plane of the free layer in response to the current and the heating.

14. The method of claim 13, wherein:
conducting the current through the magnetic tunnel junction and the cap layer includes conducting the current through a resistive heater layer.

* * * * *